(12) United States Patent
Schmidt (10) Patent No.: US 8,798,778 B2
(45) Date of Patent: Aug. 5, 2014

(54) METHOD AND SYSTEM FOR SYNCHRONIZING CHAMBER DOWN TIMES BY CONTROLLING TRANSPORT SEQUENCING IN A PROCESS TOOL

(75) Inventor: Kilian Schmidt, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 635 days.

(21) Appl. No.: 12/643,294

(22) Filed: Dec. 21, 2009

(65) Prior Publication Data
US 2010/0168892 A1 Jul. 1, 2010

(30) Foreign Application Priority Data

Dec. 31, 2008 (DE) .......................... 10 2008 063 426
Nov. 17, 2009 (DE) .......................... 10 2009 046 751

(51) Int. Cl.
*G06F 19/00* (2011.01)
*G04F 1/00* (2006.01)

(52) U.S. Cl.
USPC ............ 700/100; 438/905; 702/177; 700/108

(58) Field of Classification Search
USPC ............................. 700/100; 438/905; 702/177
See application file for complete search history.

(56) References Cited

U.S. PATENT DOCUMENTS

| | | | | |
|---|---|---|---|---|
| 5,943,230 A * | 8/1999 | Rinnen et al. | ............................ | 700/18 |
| 6,141,629 A * | 10/2000 | Yamamoto et al. | ............................ | 702/187 |
| 6,519,498 B1 * | 2/2003 | Jevtic et al. | ............................ | 700/101 |
| 6,583,509 B2 * | 6/2003 | Nulman | ............................ | 257/773 |
| 6,725,114 B1 * | 4/2004 | Jevtic | ............................ | 700/100 |
| 6,879,866 B2 * | 4/2005 | Tel et al. | ............................ | 700/100 |
| 6,950,716 B2 * | 9/2005 | Ward et al. | ............................ | 700/121 |
| 6,988,045 B2 * | 1/2006 | Purdy | ............................ | 702/83 |
| 7,051,250 B1 * | 5/2006 | Allen et al. | ............................ | 714/708 |
| 7,120,511 B1 * | 10/2006 | Tanzer et al. | ............................ | 700/100 |
| 7,127,310 B1 * | 10/2006 | Barto et al. | ............................ | 700/100 |
| 7,130,769 B1 * | 10/2006 | Allen et al. | ............................ | 702/184 |
| 7,415,316 B2 * | 8/2008 | Quarg | ............................ | 700/100 |
| 7,546,177 B2 * | 6/2009 | Dierks et al. | ............................ | 700/121 |
| 7,567,851 B2 * | 7/2009 | Schmidt | ............................ | 700/103 |
| 8,095,230 B2 * | 1/2012 | Ouyang et al. | ............................ | 700/99 |
| 2001/0012971 A1 * | 8/2001 | Nguyen | ............................ | 700/121 |
| 2002/0169695 A1 * | 11/2002 | Ko et al. | ............................ | 705/28 |
| 2004/0035360 A1 * | 2/2004 | Yamazaki et al. | ............................ | 118/715 |
| 2005/0090927 A1 * | 4/2005 | Tanaka et al. | ............................ | 700/121 |
| 2005/0203654 A1 * | 9/2005 | Shih et al. | ............................ | 700/100 |
| 2005/0288817 A1 * | 12/2005 | Chen et al. | ............................ | 700/213 |
| 2006/0142886 A1 * | 6/2006 | Ishibashi et al. | ............................ | 700/99 |
| 2006/0259198 A1 * | 11/2006 | Brcka et al. | ............................ | 700/246 |
| 2008/0051930 A1 * | 2/2008 | Oh et al. | ............................ | 700/214 |
| 2009/0317924 A1 * | 12/2009 | Ouyang et al. | ............................ | 438/5 |
| 2010/0168892 A1 * | 7/2010 | Schmidt | ............................ | 700/100 |

FOREIGN PATENT DOCUMENTS

JP 2002217076 A * 8/2002

OTHER PUBLICATIONS

Yamaguchi,(Machine translation http://www4.ipdl.inpit.go.jp/Tokujitu/PAJdetail.ipdl?N0000=60&N0120=01&N2001=2&N3001=2002-217076).*

* cited by examiner

*Primary Examiner* — Darrin Dunn (57) ABSTRACT

A cluster tool may be operated on the basis of an enhanced sequencing regime in which the supply of substrates is controlled such that a planned time of maintenance is reached for two or more process chambers simultaneously. Consequently, the occurrence of non-correlated sequential down times of various process chambers may be significantly reduced, thereby enhancing throughput and availability of complex cluster tools.

17 Claims, 5 Drawing Sheets

Recipe A

Step1　　　Step2　　　Step3　　　　　／100

| 111A | | 112A | | 113A |
|---|---|---|---|---|
| 77% | | 50% | | 79% |

| 111B | | 112B | | 113B |
|---|---|---|---|---|
| 77% | | 50% | | 79% | degas　　　tantalum　　copper

METHOD AND SYSTEM FOR SYNCHRONIZING CHAMBER DOWN TIMES BY CONTROLLING TRANSPORT SEQUENCING IN A PROCESS TOOL

BACKGROUND OF THE INVENTION

1. Field of the Invention

Generally, the present disclosure relates to the field of fabricating microstructures, such as integrated circuits, and, more particularly, to the handling of substrates in process tools, such as cluster tools, used for the fabrication of semiconductor devices or other microstructures.

2. Description of the Related Art

Today's global market forces manufacturers of mass products to offer high quality products at a low price. It is thus important to improve yield and process efficiency to minimize production costs. This holds especially true in the field of microstructure fabrication, for instance for manufacturing semiconductor devices, since, in this field, it is essential to combine cutting-edge technology with mass production techniques. It is, therefore, the goal of manufacturers of semiconductors or generally of microstructures to reduce the consumption of raw materials and consumables while at the same time improving process tool utilization. The latter aspect is especially important since, in modern semiconductor facilities, equipment is required which is extremely cost intensive and represents the dominant part of the total production costs. At the same time, the process tools of the semiconductor facility have to be replaced more frequently compared to most other technical fields due to the rapid development of new products and processes, which may also demand correspondingly adapted process tools.

Integrated circuits are typically manufactured in automated or semi-automated facilities, thereby passing through a large number of process and metrology steps to complete the device. The number and the type of process steps and metrology steps a semiconductor device has to go through depends on the specifics of the semiconductor device to be fabricated. A usual process flow for an integrated circuit may include deposition processes, such as chemical vapor deposition (CVD), physical vapor deposition (PVD) and the like, in combination with a plurality of photolithography steps to image a circuit pattern for a specific device layer into a resist layer, which is subsequently patterned to form a resist mask for further processes in structuring the device layer under consideration by, for example, etch or implant processes and the like. Thus, layer after layer, a plurality of process steps are performed based on a specific lithographic mask set for the various layers of the specified device. For instance, a sophisticated CPU requires several hundred process steps, each of which has to be carried out within specified process margins to fulfill the specifications for the device under consideration. As the majority of the process margins are device specific, many of the metrology processes and the actual manufacturing processes are specifically designed for the device under consideration and require specific parameter settings at the adequate metrology and process tools.

In a semiconductor facility, a plurality of different product types are usually manufactured at the same time, such as memory chips of different design and storage capacity, CPUs of different design and operating speed and the like, wherein the number of different product types may even reach hundreds and more in production lines for manufacturing ASICs (application specific ICs). Since each of the different product types may require a specific process flow, possibly based on different mask sets for the lithography, specific settings in the various process tools, such as deposition tools, etch tools, implantation tools, chemical mechanical polishing CMP) tools and the like, may be necessary. Consequently, a plurality of different tool parameter settings and product types may be encountered simultaneously in a manufacturing environment.

Hereinafter, the parameter setting for a specific process in a specified process tool or metrology or inspection tool may commonly be referred to as process recipe or simply as recipe. Thus, a large number of different process recipes, even for the same type of process tools, may be required which have to be applied to the process tools at the time the corresponding product types are to be processed in the respective tools. However, the sequence of process recipes performed in process and metrology tools or in functionally combined equipment groups, as well as the recipes themselves, may have to be frequently altered due to fast product changes and highly variable processes involved. As a consequence, the resulting tool performance obtained for the various process recipes, especially in terms of throughput, is a very critical manufacturing parameter as it significantly affects the overall production costs of the individual devices.

Currently, very complex process tools, referred to as cluster or cluster tools, are increasingly being used. These cluster tools may include a plurality of functional modules and entities with a plurality of process chambers, which may be operated in a parallel and/or sequential manner such that products arriving at the cluster tool may be processed therein in a plurality of process paths, depending on the process recipe and the current tool state. The cluster tool may enable the performance of a sequence of correlated processes, thereby enhancing overall efficiency by, for instance, reducing transport activities within the factory. Furthermore, the cluster tools allow increased tool capacity and availability by using several process chambers in parallel for the same process step.

In a cluster tool, several process chambers are typically served by one robot substrate handler, wherein, typically, process chambers of each process step, which may involve the operation of two or more parallel process chambers, may be accomplished such that a maximum overall throughput of the cluster tool is accomplished. For example, a frequently used rule for operating the cluster tool is adjusted such that the sequencing provides a substantially continuous supply of substrates to the "bottleneck" process step, i.e., to the process chambers of a specific process step having the least process capacity, since otherwise an idle process time at the bottleneck step may significantly affect the overall throughput of the cluster tool. Although overall enhanced performance in view of process quality and throughput may be accomplished by integrating a plurality of correlated process steps into a cluster tool, in which at least some of the correlated process steps may be performed in parallel, a complex mutual interaction of the various process chambers may determine the actual throughput behavior over time. For example, the various process chambers in the cluster tool may require maintenance activities on a regular basis, for instance based on a predetermined wafer processing capability, which may affect the overall throughput. Typically, the various process steps may be performed in parallel so that a failure or a maintenance activity in one of the parallel process chambers may not result in a complete non-productive time of the cluster tool, but may affect the throughput according to the percentage of the total over processing capacity of the process chamber under consideration. Consequently, upon performing a planned maintenance activity on one process chamber of a corresponding process step, one or more other process chambers used in this process step may still process substrates, however, at a reduced overall throughput of the cluster tools, since the over-processing capacity of each of the process chambers may be less than 100% of the throughput of the cluster tool when considered as a whole. Consequently, any down times of any of the process chambers may affect the overall throughput of the cluster tool, depending on the dedicated wafer processing capacity of the known productive process chamber, as will be described in more detail with reference to FIGS. 1a-1c.

Figure 1A:
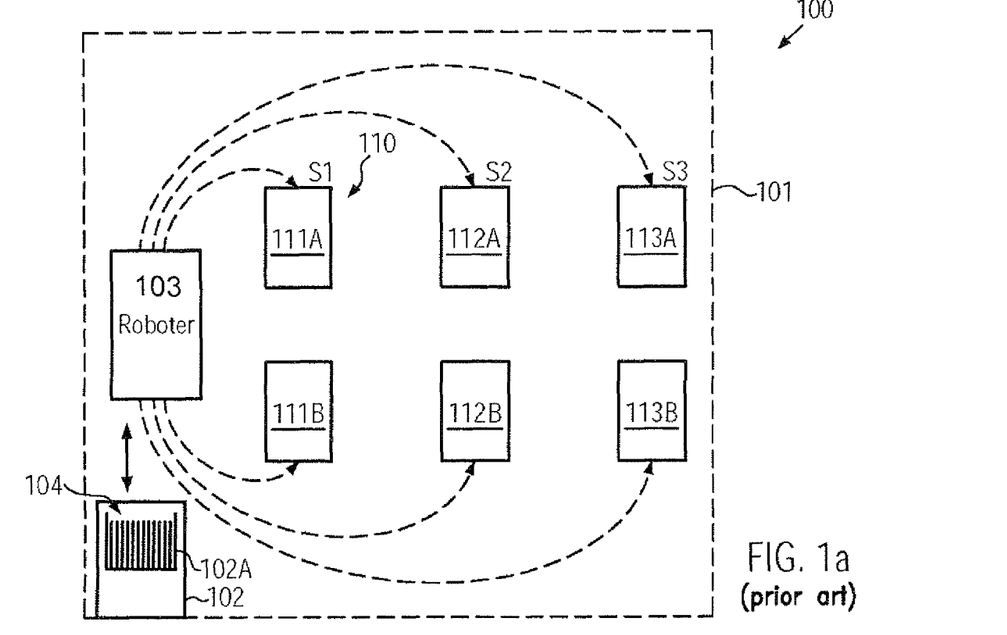
FIG. 1a schematically illustrates a cluster tool configured to perform a sequence of interrelated process steps according to conventional strategies.

FIG. 1a schematically illustrates a cluster tool 100, which may comprise a main frame 101, which may be considered as an appropriate mechanical system for accommodating the components of the cluster tool 100, such as process chambers, electronic components, mechanical components, supply lines for process gases, a transport interface for exchanging substrates with a manufacturing environment, such as a semiconductor production facility, and the like. Thus, in the main frame 101, one or more load ports 102 may be provided to provide the required substrate exchange capability with a manufacturing environment. As is well known, typically, substrates, such as wafers, may be handled on the basis of appropriate transport carriers, such as front opening unified pods (FOUP), as indicated by 102A, in which a corresponding number of substrates 104 may be supplied to and discharged from the cluster tool 100. Furthermore, the cluster tool 100 comprises a device internal transport system, such as a robot handler and the like, 103, which is operatively connected to the one or more load ports 102 and to a plurality of process chambers 110. In the example shown, the plurality of process chambers 110 may be functionally grouped into three process steps, S1, S2, S3, wherein each process step may represent a specific type of process, such as the deposition of a material layer, a surface treatment, an anneal process and the like, as required for obtaining a specific process result for substrates stepped through the cluster tool 100. For example, step S1 may be associated with two process chambers, 111A, 111B which may be considered as parallel process chambers, since the same process corresponding to step S1 is performed in any of the chambers 111A, 111B. Similarly, the process step S2 may be associated with two process chambers 112A, 112B, which perform the same process steps within the sequence of correlated process steps S1, S2, S3. Finally, the step S3 may be associated with process chambers 113A, 113B which may represent the final process step of the sequence of correlated process steps represented by the process steps S1, S2 and S3. It should be appreciated that more or less process steps may be incorporated into the overall process sequence performed within the cluster tool 100, wherein, in each step, more than two process chambers may be used, while, in some process steps, a single process chamber may be provided, if a certain degree of redundancy may be considered inappropriate.

The tool internal transport system 103, in combination with a tool internal arrangement of the process chambers 110, is configured such that the substrates 104 obtained from the load port 102 can be distributed to the process chambers 110 according to the sequence of process steps S1, S2, S3, wherein the substrates within a single process step may be distributed among the corresponding process chambers in accordance with the availability of each process chamber. That is, typically, the transport system 103 may, for the arrangement shown in FIG. 1a, deliver substrates in an alternating manner.

Figure 1B:
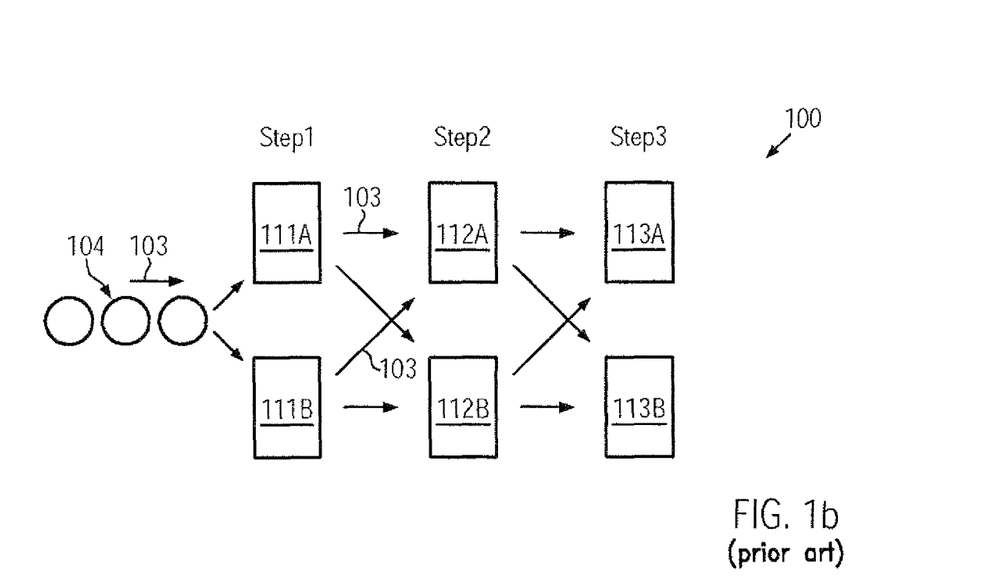
FIG. 1b schematically illustrates a cluster tool during operation.

FIG. 1b schematically illustrates the cluster tool 100 during operation. As illustrated, the substrate 104 may be supplied to the process chambers 111A, 111B of the first step by the tool internal transport system 103, typically in an alternating manner. After completing the process step S1, the substrate is supplied to any of the process chambers 112A, 112B, depending on the current availability of these process chambers, which is also typically to be performed in an alternating manner, if each process chamber is in a productive state. Similarly, the substrates processed in the chambers 112A, 112B may be supplied to the process chambers 113A, 113B depending on the current availability of these chambers, wherein, typically, the process chambers 113A, 113B may also be supplied in an alternating manner. Consequently, if all process chambers 110 are in an operable state, the overall throughput of the cluster tool 100 may be determined by that process step S1, S2, S3 which may have the least wafer processing capacity, wherein it should be appreciated that a certain degree of "loss" of throughput may be associated with any transport activities or supplying the various substrates from one process chamber to another and for loading and unloading the substrates in the corresponding process chambers. The process capacity of the transport system 103 is adapted such that, upon completing the processing of a substrate within one of the process chambers 110, the required transport capabilities may substantially immediately be available without undue waiting time. On the other hand, when a maintenance activity is required for one of the process chambers 110, operation of the cluster tool 100 may be continued, however, at a reduced overall throughput, depending on the processing capacity of the non-productive process chamber.

Figure 1C:
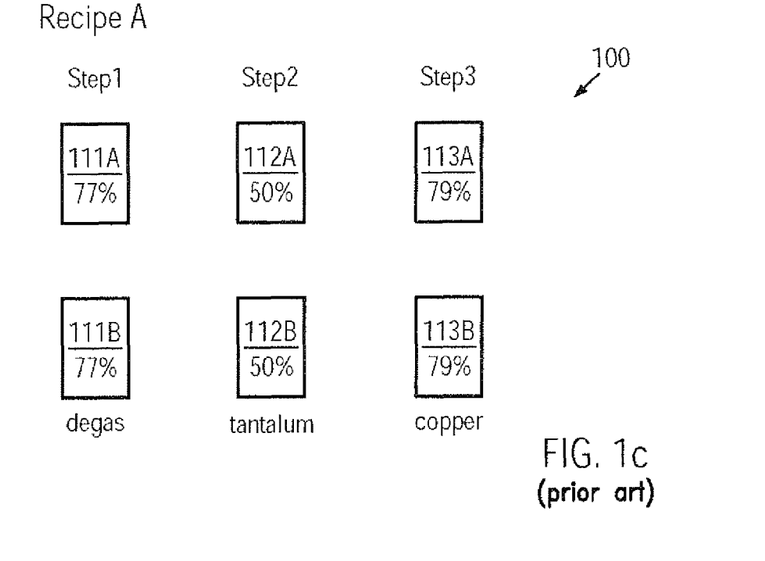
FIG. 1c schematically illustrates a cluster tool when configured to perform a deposition process for providing a conductive barrier material and a seed layer according to conventional strategies.

FIG. 1c schematically illustrates the cluster tool 100 in the form of a deposition tool, in which, for instance, conductive materials may be deposited above the substrates 104. For instance, when forming complex metallization systems of semiconductor devices, typically a highly conductive metal, such as copper, may be used, which, however, may require specific manufacturing techniques and materials in order to obtain the required degree of reliability and electrical performance. For example, copper may readily diffuse in a plurality of well-established dielectric and semiconductive materials, such as silicon dioxide, silicon and the like, which, however, may result in non-predictable significant changes of the overall behavior of circuit elements, such as transistors and the like. For this and other reasons, typically, a conductive barrier material may be deposited on a patterned dielectric material prior to actually depositing the copper material on the basis of electrochemical deposition techniques. For example, tantalum, tantalum nitride and the like are well established conductive barrier materials which provide superior copper diffusion hindering effects and also enhanced mechanical adhesion and electromigration behavior of the corresponding copper metal regions. Furthermore, in well-established electrochemical deposition techniques, a seed material, such as a thin copper layer, may be deposited on the conductive barrier material to enhance the overall deposition behavior during the subsequent electrochemical deposition of the copper bulk material. Consequently, the deposition of the conductive barrier material, such as tantalum, tantalum nitride and the like, followed by the deposition of a copper seed material may be considered as correlated process steps, which may be performed in the cluster tool 100. Additionally, the surface of the patterned dielectric material may be appropriately treated prior to actually depositing the conductive barrier material, which may, for instance, include exposure to certain atmospheric conditions at elevated temperatures so as to promote out-gassing of undesired species, such as organic materials and the like. Since a pronounced waiting time between the de-gassing step and the actual deposition of the conductive barrier layer may have a significant influence on the finally-obtained process result, it is also advantageous to include the de-gassing step into the process tool 100 to minimize the time interval between cleaning the surface and actually depositing the conductive barrier material.

Thus, the cluster tool 100 is configured to perform the three process steps 51, S2, S3, i.e., in this example, a de-gas step, i.e., step 1, a first deposition step for providing a tantalum spacer material layer, i.e., step 2, and a final deposition step for forming a copper seed material, i.e., step 3. Furthermore, as previously discussed, the manufacturing processes may typically be performed on the basis of specific parameter settings, i.e., certain atmospheric conditions, predefined process times and the like, which, however, may vary depending on the type of semiconductor device to be produced. For example, if in some products an increased thickness of the copper seed material may be required, a respective recipe, for instance indicated as recipe A, may provide appropriately set deposition conditions, which may result in a specific deposition rate, while the overall process time may be selected in accordance with the required final layer thickness. Similarly, if superior de-gassing performance may be required for a certain type of semiconductor product, corresponding process conditions and/or the process time may be appropriately selected. Consequently, based on the various process parameters, the recipe A may result in corresponding process times of the process chambers 110. For example, the process step having the longest process time per process chamber, i.e., the process time divided by the number of available process chambers, may be considered as the bottleneck process step in the tool 100. Thus, this process step may define 100% of the overall capacity of the cluster tool 100. For example, according to recipe A, process step 2, i.e., the deposition of the tantalum-based material layer, may represent the bottleneck process and may thus define 100% of the overall capacity of the cluster tool 100. Furthermore, in the example shown, it may be assumed that equivalent process chambers, i.e., the chambers associated with a specific process step, may have the same capacity due to a very similar overall configuration. Consequently, in step 2, i.e., the bottleneck step, the process chambers 112A, 112B may each have a processing capacity of 50%. Furthermore, it may be assumed that in step 1 the recipe A may result in reduced process time compared to step 2, which may thus result in a processing capacity of 77% for each of the process chambers 110A, 110B. Similarly, in step 3, recipe A may result in an individual processing capacity of 79% for each of the chambers 113A, 113B. Consequently, upon failure of a process chamber in step 1, an overall capacity loss of 23% is obtained. Similarly, a downtime of one of the chambers 112A, 112B due to failure or maintenance may result in 50% of the total tool capacity. On the other hand, a downtime of any of the process chambers 113A, 113B may result in a total capacity loss of 21%. Thus, unless there is a failure in all process chambers of a single step, the cluster tool 100 may still remain in an operable state, however, at a reduced overall throughput.

As previously indicated, specific down times of the process chambers 110 may occur in a predictable manner, since regular maintenance may be required after processing a specific number of substrates, or after a certain degree of consumption of raw materials, and the like may be detected. Thus, by appropriately configuring the process chambers 110, it may be accomplished that corresponding maintenance activities for process chambers in one process step may not occur concurrently, thereby avoiding a complete down time of the cluster tool 100. As previously discussed, significant advantages may also be associated with configuring cluster tools on the basis of correlated process steps, nevertheless a reduction of overall throughput may be caused by predictable maintenance activities, which may thus contribute to enhanced production costs, since a corresponding throughput loss may have to be compensated for by initially providing an increased wafer processing capacity.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to a technique and a system for enhancing performance of process chambers that may perform a sequence of correlated manufacturing processes, such as the sequence of processes performed in a cluster tool by synchronizing predictable maintenance activities of at least two process steps in the sequence of correlated manufacturing steps. By synchronizing the corresponding maintenance activities, the overall loss of throughput may be reduced, since a loss of throughput associated with one of the process steps may be appropriately "hidden" on the basis of the down time of the other process steps. For instance, if a predicted down time of a first process step having a certain processing capacity may be synchronized with the down time of the process chamber of another step having a higher processing capacity, the overall throughput loss of the cluster of process chambers or of the cluster tool may be determined by the loss caused by the process chamber having the lower process capacity. Thus, contrary to conventional strategies, in which predictable down times of each process chamber may result in non-correlated down times, thereby resulting in a sequential occurrence of down times in the various process steps, the present disclosure provides a sequencing regime in which at least some of the otherwise sequential predictable down times may be avoided. Thus, enhanced overall throughput of the cluster of process chambers may be accomplished.

One illustrative method disclosed herein relates to processing substrates in a manufacturing environment according to a sequence of interrelated process steps. The method comprises determining a first metric for a first process chamber of a first plurality of process chambers used to perform a first process step of the sequence of interrelated process steps, wherein a first metric indicates a time of a first planned maintenance event for the first process chamber. The method further comprises determining a second metric for a second process chamber of a second plurality of process chambers used to perform a second process step of the sequence of interrelated process steps, wherein the second metric indicates a time to a second planned maintenance event for the second process chamber. Additionally, the method comprises controlling supply of substrates to the first and second plurality of process chambers on the basis of the first and second metrics so as to synchronize the first and second planned maintenance events.

A further illustrative method disclosed herein relates to sequencing of substrates in a cluster tool. The method comprises determining a time to maintenance for two or more of a plurality of process chambers of the cluster tool, wherein the plurality of process chambers performs two or more interrelated process steps. Additionally, the two or more of the plurality of process chambers are used for performing at least two different process steps of the plurality of interrelated process steps. Additionally, the method comprises controlling the supply of substrates to the two or more process chambers so as to synchronize the time to maintenance for the two or more process chambers.

One illustrative control system disclosed herein comprises a maintenance monitor operatively connected to a plurality of process chambers used to process substrates according to at least two different process steps, wherein the maintenance monitor is configured to provide a value indicating a time to a planned maintenance for each of the plurality of process chambers. Furthermore, the control system comprises a synchronizing unit operatively connected to the maintenance unit and configured to determine a sequencing regime for the plurality of process chambers so as to synchronize the time to a planned maintenance for at least two of the plurality of process chambers.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to techniques and systems in which overall throughput of clustered process chambers may be enhanced by synchronizing the time to planned maintenance events for process chambers corresponding to different process steps of a sequence of interrelated process steps performed by the clustered process chambers. The synchronization of the planned maintenance events can be accomplished for maintenance activities that are substantially determined by a set count or number of substrates processed in the corresponding process chambers. That is, in manufacturing processes, the condition of the respective process chamber may be correlated with the number of substrates processed therein, for instance in view of replacing consumables, replacing specific mechanical and other components of the process chamber, cleaning the process chamber and the like, so that a specific metric or value indicating the time to the next planned maintenance may be available. Consequently, the sequencing of substrates within the clustered process tools may be appropriately controlled such that a planned maintenance event in two or more process steps may occur at the same time, thereby avoiding a sequential occurrence of various down times, as is the case in conventional strategies. The sequencing of the substrates based on a corresponding metrics indicating the various times to the next planned maintenance event may be accomplished without a throughput loss, since the clustered process chambers may still be operated at 100% of the overall throughput. To this end, the internal sequencing of the substrates may be controlled on the basis of the corresponding substrate processing capacities, such that each process step may still provide 100% of the overall tool capacity. Consequently, the overall availability of a specific cluster of process chambers may be increased, thereby providing enhanced cluster capacity, which may in turn result in reduced overall production costs. For a given installed cluster capacity, hence, reduced overall cycle times for the products to be processed in the cluster may be accomplished due to effective higher capacity obtained by the synchronization of planned maintenance events. Thus, an improvement of several percent with respect to cluster tool capacity may be accomplished.

Figure 2A:
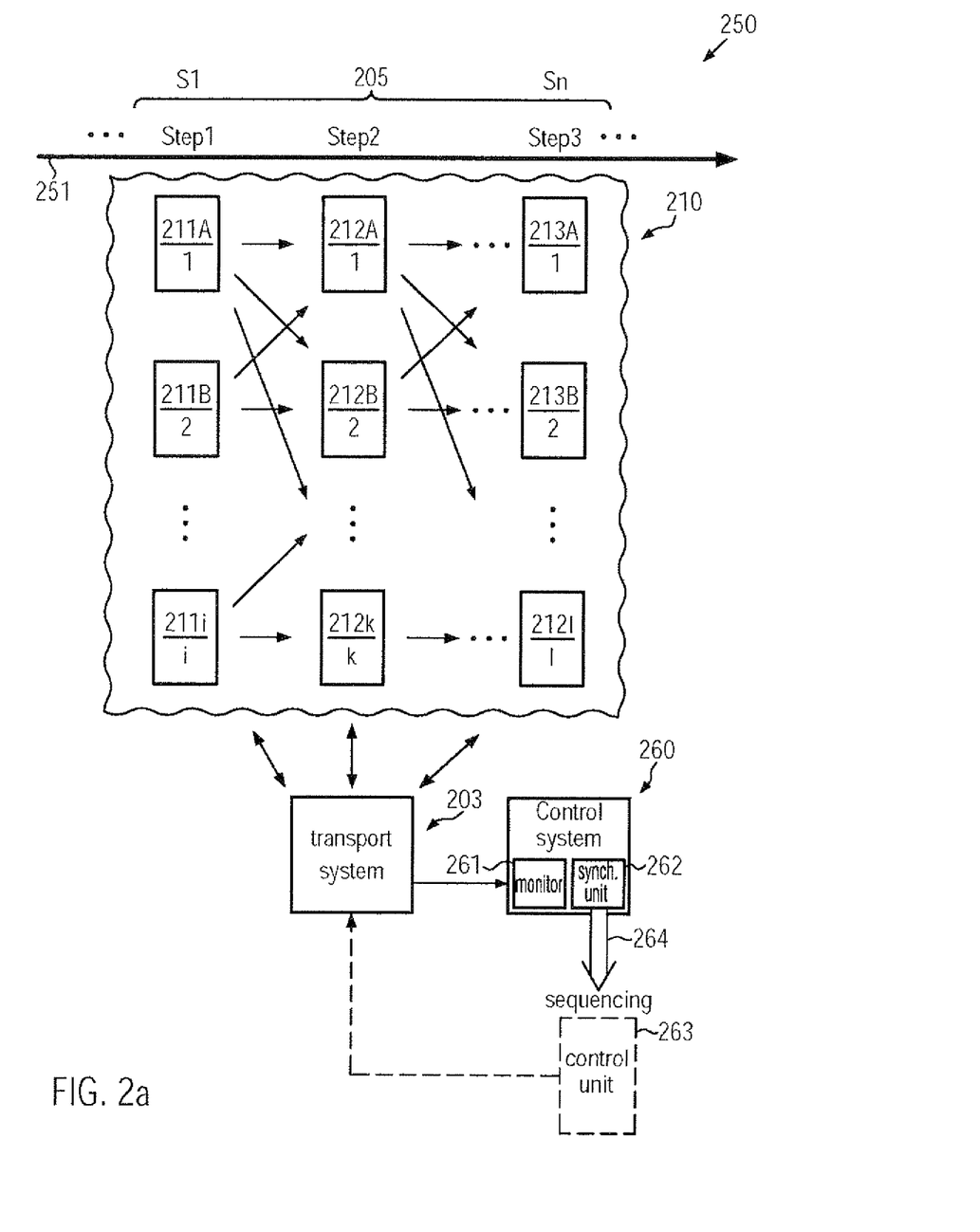
FIG. 2a schematically illustrates a cluster of process chambers, for instance provided on the basis of a cluster tool, in combination with a control system for controlling the supply of substrates in order to synchronize a planned down time for at least two process chambers, according to illustrative embodiments.
Figure 2B:
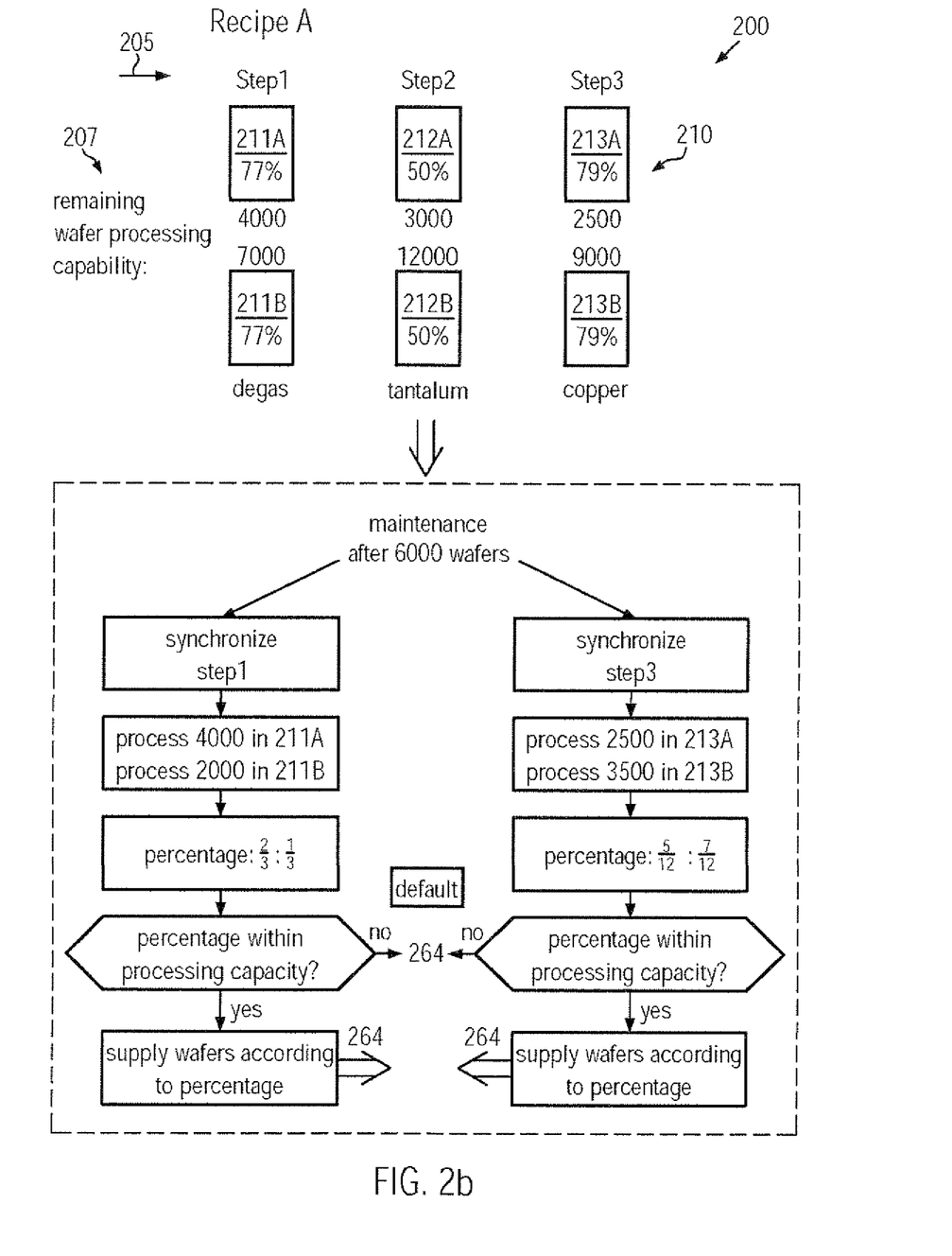
FIG. 2b schematically illustrates a cluster tool and a corresponding scheme for operating the same to enhance overall throughput by synchronizing planned down times of the cluster tool, according to still other illustrative embodiments.
Figure 2C:
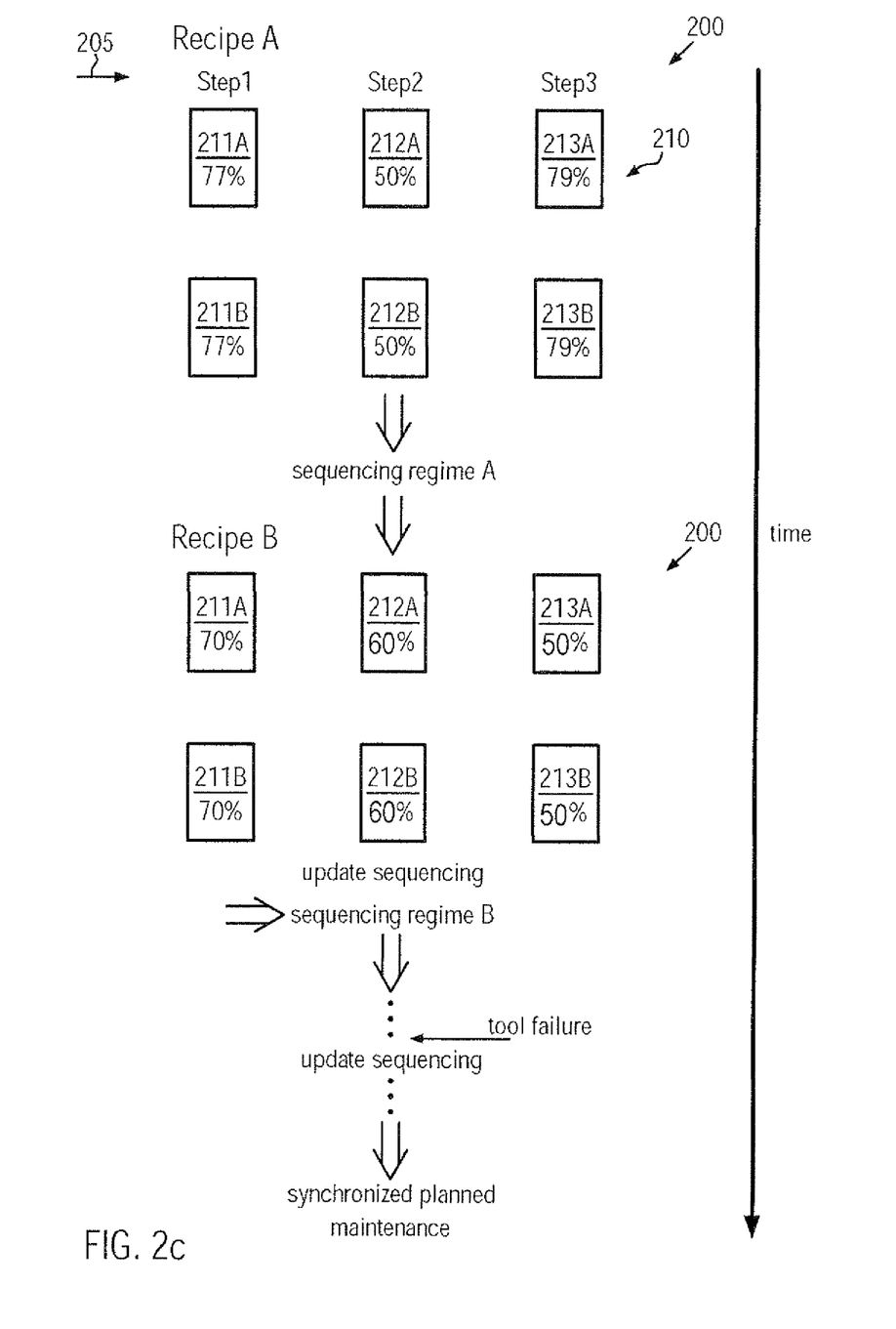
FIG. 2c schematically illustrates a cluster tool configured in accordance with different recipes and a corresponding scheme for operating the cluster tool so as to synchronize planned down times of various process chambers by taking into consideration the various different configurations, according to still further illustrative embodiments.

With reference to FIGS. 2a-2c. further illustrative embodiments will now be described in more detail, wherein reference may also be made to FIGS. 1a-1c. if required.

FIG. 2a schematically illustrates a manufacturing environment 250 that, in one illustrative embodiment, represents a manufacturing environment for the fabrication of semiconductor devices, which are typically formed on the basis of an appropriate carrier material, also referred to as substrate, wafer and the like. The manufacturing environment 250 may comprise a plurality of process tools to process corresponding substrates on the basis of a specific manufacturing flow 251, which may include several hundred or more process steps for complex semiconductor devices, such as microprocessors and the like. The manufacturing flow 251 may comprise a sequence 205 of interrelated manufacturing steps or process steps, indicated as S1 . . . Sn, that are performed in a plurality of process chambers 210 without significant transport activities and corresponding waiting times between each of the steps S1 . . . Sn. For instance, "without significant transport activities" may be understood such that the processing of substrates within the cluster of process chambers 210 may not depend on the status and capacity of an automated transport system of the environment 250, as long as a specific initial number of substrates is available at process chambers 211A . . . 211i corresponding to step S1 of the sequence 205. In this case, processing of the substrates may occur in a substantially continuous manner, as long as at least one process chamber in each of the steps S1 . . . Sn is in a operable state. For instance, the plurality of process chambers 210 may comprise process chambers 212A . . . 212k for step 2, wherein numbers of process chambers per each step may be different. Thus, step Sn may be performed on the basis of process chambers 213A . . . 213l wherein 213l represents the number of process chambers as required for obtaining a desired substrate processing capacity for step Sn. In some illustrative embodiments, the cluster of process chambers 210 may be provided in the form of a cluster tool, as previously explained with reference to the tool 100 and as will be described in more detail later on. Moreover, the process chambers 210 may be operatively connected to a transport system 203, which may provide the required transport capabilities for mechanically interconnecting the process chambers 210 and thus provide substrates for each of the steps S1 . . . Sn in order to maintain a substantially continuous operation of the cluster 210. In this respect, a substantially continuous operation should be understood as an operation in which throughput of the cluster 210 is substantially not restricted by the capabilities of the transport system 203 that is determined by the processing capacities of each of the steps S1 . . . Sn. Consequently, the transport system 203 may have an appropriate configuration so as to provide the required transport activities and also enable a certain degree of "buffering" of substrates in order to timely supply substrates to any available process chambers and also pick up substrates that are available for further processing in subsequent steps of the sequence 205. For example, typical cluster tools for processing substrates of 300 mm diameter comprise a tool internal transport system with a so-called dual blade robot handler that provides a required capacity of buffering a substrate while enabling an additional substrate transport activity for another substrate.

Furthermore, the transport system 203 may be operatively connected to a control system 260, which may be configured to provide an appropriate sequencing regime 264, which, when implemented in the transport system 203, may result in the synchronization of planned down times of one process chamber corresponding to one of the steps S1 . . . Sn, for instance one of the process chambers 211A . . . 211i, and of a down time of at least one process chamber corresponding to a different process step S1 . . . Sn. For instance, the down times of one of chambers 211A . . . 211i and one of the chambers 212A . . . 212k may be synchronized. For this purpose, the control system 260 may comprise a monitor unit 261 that may be configured to monitor a metric indicative of the remaining substrate processing capability of each of the process chambers 210. For instance, as previously indicated, in many cases, a maintenance of a process chamber may be performed on the basis of the number of processed substrates, which may thus be efficiently used as a metric for indicating the time to the next planned maintenance activity. In other cases, the metrics monitored by the unit 261 may represent the state of any consumables of the process chamber under consideration, such as the consumption of a sputter target, which may be used in sputter deposition processes and the like. Since the corresponding metric may also be correlated with the number of substrates processed in the corresponding process chamber, the metrics may also be used as an indication of a time to the next planned maintenance activity. For example, a standardized format for using the metrics in the control system 260 may be established by using appropriately selected "conversion factors," which, for instance, may relate a consumption figure to the number of substrates. Consequently, upon receiving the corresponding metrics, the monitor unit 261 may determine a time to a next planned maintenance activity for each of the process chambers 210, wherein it should be appreciated that the "time" to the next maintenance is to be understood in terms of the accumulated operational time of a corresponding process chamber, which may, as previously discussed, be readily "measured" by the number of substrates that can be processed prior to requiring the next maintenance activity. The control system 260 may further comprise a synchronization unit 262, which may be configured to determine the sequencing regime 264 on the basis of the metrics obtained by the monitor 261. That is, the synchronization unit 262 may determine an appropriate distribution of substrates to be supplied to a specific process chamber within a corresponding process step such that, after processing a given number of substrates, the specific process chamber may require the maintenance activity, while at the same time a process chamber in another process step may also require the maintenance activity, so that the corresponding down times of these process chambers are "synchronized." Consequently, the overall loss of throughput of the cluster 210 is determined by the process chamber having the lowest substrate processing capacity of the non-productive process chambers.

Upon operating the cluster 210 in the manufacturing environment 250, the control system 260 may receive the metrics indicating the time to the next maintenance, as explained above, which may, for instance, be accomplished, in one illustrative embodiment, by supplying the initial substrate processing capability of each process chamber 210 to the system 260, while also obtaining the number of actually processed substrates, which may be accomplished by obtaining information from the transport system 203. Thus, for a given state of the cluster 210, the control system 260 may determine the sequencing regime 264 so as to synchronize the down times of two or more process steps S1 . . . Sn, wherein the sequencing regime 264 may be implemented in the transport system 203 so as to actually supply substrates through each of the process chambers 210 in a manner that may result in the synchronization of the corresponding maintenance activities. In one illustrative embodiment, the control system 260 may comprise a control unit 263 that is operatively connected to the synchronization unit 262 so as to receive a sequencing regime 264 there from and provide appropriate control information that may be transmitted to the transport system 203 in order to appropriately control the supply of substrates within the cluster 210. In this manner, a substantially continuous adaptation of the sequencing regime 264 to the current status of the cluster 210 may be accomplished, for instance in view of occurrence of non-predictable failures of one or more of the process chambers 210, a change in recipe, which may result in a change of the various processing capacities, as will be explained later on in more detail, and the like. Thus, even upon occurrence of any event that may interfere with the presently-applied sequencing regime 264, a corresponding re-determination may be performed so as to still maintain synchronization of at least two down times for planned maintenance activities.

FIG. 2b schematically illustrates a cluster of process chambers 210 according to an illustrative embodiment in which the cluster 210 may be provided in the form of a cluster tool 200, that is, the process chambers 210 and the corresponding transport capabilities may be provided within a single mainframe, as is also previously explained with reference to the cluster tool 100. Furthermore, in the example shown, a tool configuration including six process chambers, i.e., two process chambers may be used for three different process steps S1, S2 and S3, wherein it should be appreciated that any other configuration may be used, for instance as described above with reference to FIG. 2a. For instance, similar to the previously explained example, the cluster tool 200 may represent a process flow including the steps S1, S2, S3 in which a conductive barrier material, such as tantalum and the like, in combination with a copper seed material may be deposited. For this purpose, step S1 may represent a degassing step, as discussed above, while steps S2 and S3 may represent the deposition of a tantalum-based material and a copper-based material, respectively. Furthermore, the sequence 205 including the steps S1 . . . S3 may be performed on the basis of a recipe A, that is, each of the process steps S1 . . . S3 is performed on a predetermined parameter setting, which may result in a processing capacity of 77% for the process chambers 211A, 211B, while a capacity of 50% may be obtained for the chambers 212A, 212B and a capacity of 79% may be obtained for the chambers 213A, 213B. Furthermore, the current state of the cluster tool 200 with respect to a "time" to the next planned maintenance event for each of the chambers 210 may be determined. For instance, the corresponding metrics, i.e., the remaining wafer processing capability, may be provided in the form of a number of substrates that can be processed until the next maintenance activity is required. For instance, the next maintenance step for the degas chamber 211A may be after processing of 4000 substrates, while, for the degas chamber 211B, 7000 substrates can be processed. The chambers 212A, 212B which represent the bottleneck chambers, may have a "time" to next planned maintenance of 3000 and 12000 substrates, respectively, while the chambers 213A, 213B may have times corresponding to 2500 and 9000 substrates, respectively. The corresponding metrics 207 and in some illustrative embodiments, the corresponding processing capacities of the chambers 210 may be provided to the control system 260. Consequently, in the example illustrated above, the next maintenance of one of the "bottleneck" chambers, i.e., the process chamber 212A, may be required after the processing of 3000 substrates in the chamber 212A. In some illustrative embodiments, the sequencing of substrates to the chambers 212A, 212B, i.e., the bottleneck step, may be in an alternating manner in order to maintain 100% of the total capacity of the cluster tool 200. Consequently, maintenance may be required for the chamber 212A after processing 6000 substrates in the tool 200, i.e., 3000 substrates in the chamber 212A and 3000 substrates in the chamber 212B. Thus, in order to synchronize a down time of the tool in step 1, i.e., a down time of the chamber 211A, the processing of the 6000 substrates has to be redistributed so as to process 4000 substrates in the chamber 211A and process 2000 substrates in the chamber 211B. Thus, a corresponding percentage for supplying substrates to step 1 will be two thirds (⅔) for the chamber 211A and one third (⅓) for the chamber 211B. Consequently, if supplying the substrates according to these percentages, the chambers 211A and 212A may be synchronized with respect to their down times in view of the next planned maintenance activity. In some illustrative embodiments, it may be verified whether a percentage determined for each of the process chambers in step 1 may be within the processing capacity of the process chambers 211A, 211B. That is, the processing capacity of the chambers have to be equal to or greater than the required percentage. In the example illustrated in FIG. 2b, the percentage of the chamber 211A may correspond to two-thirds or 67%, while the actual processing capacity corresponds to 77%. Consequently, a corresponding distribution of substrates to the process chambers 211A, 211B according to the percentages two-third and one-third, respectively, is within the processing capability of the process chambers 211A, 211B. Hence, the control system 260 may establish a corresponding sequencing regime 264 so as to actually supply substrates to step 1 according to the previously-determined percentages. Similarly, if a further reduction of throughput loss may be desired, also the time to the next planned maintenance in step 3 may be synchronized with at least one of the down times of steps 1 or 2, wherein, in the present example, a synchronization with down times of both step 1 and step 2 may be accomplished. Thus, also in this case, the 6000 substrates to be processed may be distributed so as to process 2500 substrates in the chamber 213A, while 3500 substrates are to be processed in chamber 213B. The corresponding percentages are 5/12 and 7/12, respectively. Thus, it may again be verified whether the greater of these percentages is within the processing capacity of the chambers 213A, 213B. Hence, since 7/12 corresponds to 58.3% of the overall throughput of the tool 200, this required processing capacity is well within the capacities of the process chambers 213A, 213B. Consequently, the distribution of substrates to the chambers corresponding to step 3 may be accomplished on the basis of the previously-determined percentages, thereby also synchronizing the down time of chamber 213A of step 3 with the down times of the chambers 211A, 212A. Consequently, by implementing the above-described algorithm into the control system 260, for instance in the synchronization unit 262 (FIG. 2a), the sequencing regime 264 may be established with a high degree of reduction of throughput loss caused by predictable maintenance activities. It should be appreciated that if step 1 or step 3 may not be synchronized with step 2, for instance due to a non-compatibility of the resulting percentages with the actual processing capacities, the sequencing regime 264 may be appropriately adapted, for instance by selecting any default value, for instance, selecting an alternating supply for the corresponding process step. For instance, if, in step 1, the percentage may not be compatible with the capacities of 77%, for instance the metric 207 is significantly greater or less than the number as indicated in FIG. 2b, both chambers 211A, 211B may be supplied with equal percentages or an appropriate percentage may be determined, which may allow enhanced conditions for a further synchronization procedure in the next but-one maintenance interval of any of the other process steps.

FIG. 2c schematically illustrates a cluster tool 200 in various configurations in the course of time, that is, in the course of being operated in the manufacturing environment 250. For example, for a certain time period, i.e., for a certain number of substrates, the tool 200 may be configured according to recipe A thereby resulting in the processing capacities, as also previously used for the tool configuration as shown in FIG. 2b. Consequently, in this case, a sequencing regime A may be established, for instance on the basis of the above-described techniques in order to obtain a synchronization of corresponding down times of at least two process chambers, as previously discussed. During the operation of the tool 200 on the basis of the sequencing regime A, a change of recipe may be required, however, without actually performing the next planned maintenance activity. For example, a recipe B may now be required for the processing of further substrates, wherein the change in recipe may also result in a corresponding change of the processing capacities, as indicated. For example, the chambers 211A, 211B may have a capacity of 70%, while the chambers 212A, 212B may now have a capacity of 60%. Finally, the chambers 213A, 213B may have a capacity of 50%, since, according to recipe B, step S3 may represent the bottleneck step of the sequence of interrelated process steps, as previously explained. Consequently, on the basis of the new processing capacities and based on the current metrics that indicate the remaining time to maintenance, a previously-used sequence regime A may be updated so as to obtain a sequencing regime B, which may result in the synchronization of at least two maintenance events. Thus, operation of the tool 200 may be continued, wherein, for example, a tool failure may occur, which may result in a responding change of overall tool capacity, or a corresponding maintenance activity may be performed, in which an updated time to next planned maintenance may result and the like. Consequently, in some illustrative embodiments, also in this case, a sequencing regime may be updated on the basis of a current status of the tool 200 and the updated metrics indicating the time to the next planned maintenance interval. Hence, after a certain operation phase of the tool 200, a planned maintenance for two or more process chambers of different process steps may be performed concurrently, thereby reducing overall throughput loss, as previously explained. Consequently, the sequencing regime may be adapted in a dynamic manner, thereby achieving a high degree of synchronization, which may finally result in superior capacity of the tool 200. As previously indicated, by hiding a down time of one or more process chambers of higher processing capacity "behind" the down time of a process chamber of lower processing capacity, an overall increase of throughput of several percent may be obtained, which may significantly contribute to reduced production costs.

As a result, throughput loss of clustered process chambers, such as cluster tools, may be reduced by coordinating or synchronizing down times of process chambers without affecting tool capacity between the synchronized down times. For this purpose, the sequencing, i.e., the supply of substrates to the various process chambers in the cluster, may be appropriately coordinated so as to reach the required planned time for maintenance for at least two or more process chambers substantially simultaneously. Consequently, enhanced availability and throughput of a given cluster of process chambers may be accomplished.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of processing substrates in a manufacturing environment according to a sequence of interrelated process steps, the method comprising:

determining a first metric for a first process chamber of a first plurality of process chambers used to perform a first process step of said sequence of interrelated process steps, said first metric indicating a first remaining substrate processing capability for said first process chamber, wherein a first planned maintenance event occurs in response to consumption of the first remaining substrate processing capability;

determining a second metric for a second process chamber of a second plurality of process chambers used to perform a second process step of said sequence of interrelated process steps, said second metric indicating a second remaining substrate processing capability for said second process chamber, wherein a second planned maintenance event occurs in response to consumption of the second remaining substrate processing capability;

controlling supply of substrates to said first and second plurality of process chambers based on said first and second metrics so as to synchronize said first and second planned maintenance events, wherein controlling supply of substrates to said first and second plurality of process chambers comprises determining a percentage of substrates to be supplied to each process chamber to synchronize said first and second planned maintenance events and determining whether or not said percentage is equal to or less than a process capacity of said first and second plurality of process chambers; and performing said first and second planned maintenance events at approximately a same time as performing said first and second process steps in an additional process chamber of the first plurality of process chambers and an additional process chamber of the second plurality of process chambers respectively.

2. The method of claim 1, further comprising controlling supply of substrates so as to maintain full processing capacity of said first and second process steps.

3. The method of claim 1, wherein one of said first and second plurality of process chambers represents a lowest processing capacity of said sequence.

4. The method of claim 3, further comprising supplying said substrates equally to said one of said first and second plurality of process chambers that represents the lowest processing capacity.

5. The method of claim 1, further comprising determining a third metric for a third process chamber of a third plurality of process chambers used to perform a third process step of said sequence of interrelated process steps, wherein said third metric indicates a time to a third planned maintenance event for said third process chamber and wherein supply of substrates to said third plurality of process chambers is controlled so as to synchronize said third planned maintenance event with said first and second planned maintenance event.

6. The method of claim 1, wherein controlling supply of substrates to said first and second plurality of process chambers comprises determining a processing capacity for each of said first and second pluralities of process chambers for processing said substrates in said sequence.

7. The method of claim 6, wherein determining a processing capacity for each of said first and second process chambers comprises identifying process recipes to be applied for processing said substrates and determining said processing capacities for each of said process recipes.

8. The method of claim 1, wherein said sequence of interrelated processes is performed in a cluster tool.

9. The method of claim 1, further comprising processing a plurality of substrates through at least one of said first and second process chambers.

10. A method of sequencing substrates in a cluster tool, the method comprising:
determining a time to maintenance for two or more of a plurality of process chambers of said cluster tool using remaining substrate processing capabilities of the process chambers, said plurality of process chambers performing two or more interrelated process steps, said two or more of the plurality of process chambers being used for performing at least two different process steps of said plurality of interrelated process steps, and wherein maintenance is performed for the process chambers in response to consumption of the remaining substrate processing capability of a corresponding process chamber;
determining a processing capacity for each of said plurality of process chambers;
controlling supply of substrates to said two or more process chambers so as to synchronize said time to maintenance for said two or more process chambers, wherein controlling supply of substrates to said two or more process chambers comprises determining a percentage of substrates to be supplied to each of said two or more process chambers to synchronize said time to maintenance for said two or more process chambers and verifying that each percentage is compatible with an associated processing capacity of said two or more process chambers; and
performing maintenance on said two or more process chambers at approximately a same time as time as performing said first and second process steps in at least two additional process chambers of the plurality of process chambers other than said two or more process chambers of the plurality of process chambers.

11. The method of claim 10, wherein said processing capacity is determined for each process recipe to be applied when processing said substrates in said cluster tool.

12. The method of claim 10, wherein one of said two or more process chambers has a lowest processing capacity.

13. The method of claim 10, further comprising processing a plurality of substrates through at least one of said first and second process chambers.

14. The method of claim 10, further comprising updating said percentages after at least one of an occurrence of a tool failure of said cluster tool and completing a maintenance activity associated with said time to maintenance.

15. A control system, comprising:
a maintenance monitor operatively connectable to a plurality of process chambers used to process substrates according to at least two different process steps, said maintenance monitor being configured to provide a value indicating a remaining substrate processing capability for each of said plurality of process chambers, wherein planned maintenance of each of said plurality of process chambers occurs in response to consumption of the remaining substrate processing capability for a corresponding process chamber;
a synchronizing unit operatively connected to said maintenance monitor and configured to determine a sequencing regime for said plurality of process chambers so as to synchronize a time to the planned maintenance for at least two of said plurality of process chambers, said planned maintenance to occur at approximately a same time as performing said at least two different process steps for said at least two other process chambers of said plurality of process chambers; and
a control unit configured to control a supply of substrates to a first and second plurality of process chambers based on determining a percentage of substrates to be supplied to each process chamber to synchronize first and second planned maintenance events and determining whether or not said percentage is equal to or less than a process capacity of said first and second plurality of processing chambers.

16. The control system of claim 15, wherein the control unit is connected to said synchronizing unit and to a transport system connected to said plurality of process chambers, wherein said control unit is configured to control said transport system on a basis of said sequencing regime.

17. The control system of claim 15, wherein said control system is a part of a cluster process tool configured to process substrates for semiconductor products.

* * * * *